US012363845B1

(12) United States Patent
Agnello et al.

(10) Patent No.: US 12,363,845 B1
(45) Date of Patent: Jul. 15, 2025

(54) HINGED GLASS ARTICLE

(71) Applicant: CORNING INCORPORATED, Corning, NY (US)

(72) Inventors: Gabriel Pierce Agnello, Corning, NY (US); Joy Banerjee, Corning, NY (US); Dragan Pikula, Horseheads, NY (US); Yousef Kayed Qaroush, Painted Post, NY (US); Vitor Marino Schneider, Painted Post, NY (US); Yaochi Wei, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 18/775,595

(22) Filed: Jul. 17, 2024

Related U.S. Application Data

(60) Provisional application No. 63/638,146, filed on Apr. 24, 2024.

(30) Foreign Application Priority Data

May 24, 2024 (GB) ...................................... 2407456

(51) Int. Cl.
*C03C 14/00* (2006.01)
*H05K 5/02* (2006.01)
(Continued)

(52) U.S. Cl.
CPC ............. *H05K 5/03* (2013.01); *H05K 5/0226* (2013.01); *C03C 14/004* (2013.01); *G09F 9/301* (2013.01)

(58) Field of Classification Search
CPC .................................. G09F 9/301; H05K 5/03
See application file for complete search history.

(56) References Cited

U.S. PATENT DOCUMENTS

2021/0061694 A1\* 3/2021 Moon ....................... C03B 5/16
2022/0220021 A1\* 7/2022 Wegener ................... C03C 3/11
(Continued)

FOREIGN PATENT DOCUMENTS

| CN | 117819807 A | 4/2024 |
| WO | 2024/113959 A1 | 6/2024 |

OTHER PUBLICATIONS

GB Search Report, GB application No. 2407456.9, dated Jun. 25, 2024, 4 pages, European Patent Office.

*Primary Examiner* — Humera N. Sheikh
*Assistant Examiner* — Julia L Rummel
(74) *Attorney, Agent, or Firm* — William M. Johnson; Russell S. Magaziner

(57) ABSTRACT

A hinged glass article includes wings including glass and a hinge positioned between the wings. The wings fold about the hinge. The hinge includes a glass portion integrally joined to the wings and a polymer portion overlaying the glass portion. The glass portion of the hinge includes a first surface facing away from a second surface thereof. The polymer portion overlays the first surface. The glass portion of the hinge is asymmetric (with the wings unfolded) such that halves of the glass portion of the hinge do not mirror one another about a lengthwise middle of the hinge. Also, the first surface of the glass portion of the hinge is free of small inclusions impinging thereupon that have a linear cross-sectional dimension extending fully thereacross and through a center thereof greater than 2 μm and less than 30 μm.

16 Claims, 8 Drawing Sheets

(51) Int. Cl.
*H05K 5/03* (2006.01)
*G09F 9/30* (2006.01)

(56) References Cited

U.S. PATENT DOCUMENTS

2022/0287195 A1\* 9/2022 Chen ...................... B32B 17/06
2023/0416137 A1  12/2023 Chen et al.

\* cited by examiner

HINGED GLASS ARTICLE

PRIORITY

This application claims the priority benefit of U.S. Application No. 63/638,146, filed on Apr. 24, 2024 and Great Britain Application No. 2407456.9, filed on May 24, 2024, which also claims priority to U.S. Application No. 63/638,146, filed on Apr. 24, 2024, each of which is hereby incorporated by reference herein in its entirety.

BACKGROUND

Aspects of the present disclosure relate to glass articles, such as hinged glass articles that may be used with a foldable display for example.

Glass may be used as a protective cover or supportive substrate for digital displays, such as those of cellular phones, laptop computers, tablet computers, and other computerized devices. The glass for such purposes may be made with constituents such as lithia or titania, for example, which may be used to facilitate chemical strengthening of the glass by so-called ion-exchange tempering and/or to promote other properties of the glass, such as stiffness, scratch resistance, optical transparency. Further, the glass may be formed or otherwise configured to fold, such as along a linear axis, for example folding in half or thirds. The axis and accompanying structure may be referred to as a hinge, and glass adjoining the hinge and folded about the hinge may be referred to as wings.

Energy and resources required to melt and form such glasses may be considerable, not to mention energy cost and environmental impact to mine constituent materials of the glass. Further, glass configured to fold may be thin and easy to break. A need exists to reduce energy and resources used to make hinged glass articles that are reliable and resist breakage.

SUMMARY

Glass may be made and formed into large sheets. The glass of such sheets may then be cut to the shape of a particular geometry, and otherwise processed to form the glass into a hinged glass article, as may be used with a display or otherwise. Typically the glass of such articles may be very thin, such as less than a millimeter in thickness for example, especially along a hinge. As such, Applicants have been careful to avoid formation or use of glass with defects when making hinged glass articles, which may be a source of cracking and breakage of the glass. Glass inspection equipment, such as Dr. Schenk's GlassInspect (see, e.g., https://www.schenkvision.com) and equipment of TSI Incorporated, may be used for in-line inspection to identify bubbles or other inclusions in sheets of glass. Glass with defects may then be discarded and not used or formed into a hinged article or corresponding device, such as a foldable computerized display.

Certainly defects can be a source of crack nucleation and breakage in glass, such as the glass of hinged glass articles. However, according to an aspect of the present disclosure, Applicants were surprised to discover that inclusions in glass of a hinged glass article may be just fine as well, actually not significantly undermining reliability. Applicants also found that size of the inclusions was not the controlling factor, and glass of a hinged glass article may have inclusions with a range of sizes, such as dimensions between 2 to 30 µm for example, without ill effect, perhaps larger. (Inclusions too large may be unsightly.) As such, glass with inclusions need not be discarded for fear of weakness or lesser performance in folding uses. Accordingly, energy expenditure associated with manufacture and formation of hinged glass articles may be reduced, saved by no longer needing to rework the glass, and/or reduced by selecting raw materials or manufacturing processes that no longer need refinement (e.g., high levels of batch constituent purity) to such a degree.

According to an aspect of the present disclosure Applicants discovered that with hinged glass articles, locations of inclusions largely control reliability of the hinged glass article—while the rest of the hinged glass article may include inclusions, a surface of the hinge that goes into tension during folding of the hinged glass article should be free of such inclusions. The hinged glass article may be just fine to have inclusions in the wings, such as within the wings or even on surfaces of the wings. Further, the hinged glass article may be fine to have inclusions buried within the hinge or on a surface of the hinge that is not in tension as the hinged glass article folds. However, inclusions on the surface of the hinge that goes into tension during folding, even if very small, such as having a largest cross-sectional dimension of 2 µm for example (or even smaller, such as 1 µm, 0.5 µm, which may be more difficult to find with inspection), may still greatly impact reliability of the hinged glass article despite being so small, and therefore should be carefully prevented or otherwise controlled.

Further, during formation of a glass portion of a hinge that has a reduced thickness compared to that of adjoining wings, inclusions in the glass may influence geometry of the hinge, producing local features, such as dips, changes in slope, bumps, and other complexity when viewed in profile. Such complexity may also be influenced by other factors, such as etchant placement, mask design, polishing regime, etc. Surprisingly, Applicants have found that complex hinge geometry may also be just fine in terms of reliability and performance of the hinge in folding uses. Put another way, hinges of thin glass articles as disclosed herein need not have simple geometries, such as oval-shaped recesses, trapezoidal recesses, V-shaped recesses, or other such geometries. In profile, sides of a recess corresponding to a hinge may not be symmetric, may not be straight, may not share the same slope as one another, may terminate in the recess at different depths from one another, etc. Perhaps even more surprisingly, such geometries may actually provide a benefit of obscuring the hinge by obfuscating boundaries and features of the hinge, making such features less visible.

According to an Aspect 1 of the present disclosure a hinged glass article comprises wings comprising glass (e.g., amorphous, vitreous solid) and a hinge positioned between the wings. The hinge comprises a glass portion integrally joined to the wings, where "integrally joined to" refers to unbroken continuity of glass in terms of physical connection and composition, allowing for subtle variation due to chemical tempering for example. The glass portion of the hinge comprises a first surface facing away from a second surface thereof. The wings fold about the hinge with the first surface experiencing a greater tensile stress than the second surface, when the wings are folded. The glass comprises one or more small inclusions having a linear cross-sectional dimension extending fully thereacross and through a center thereof greater than 2 µm and less than 30 µm. However, the first surface of the glass portion of the hinge is free of such small inclusions impinging thereupon.

According to an Aspect 2, the hinged glass article of Aspect 1 is such that the small inclusions comprise one or more platinum particles.

According to an Aspect 3, the hinged glass article of Aspect 2 is such that the platinum particles are acicular.

According to an Aspect 4, the hinged glass article of Aspect 2 is such that at least one or more of the platinum particles have a length of at least 10 μm and a width orthogonal thereto less than a third of the length.

According to an Aspect 5, the hinged glass article of Aspect 1 is such that the small inclusions of the glass comprise inclusions having a linear cross-sectional dimension greater than 10 μm.

According to an Aspect 6, the hinged glass article of Aspect 1 is such that the glass portion of the hinge has a thickness (between the first and second surfaces) that is less than a thickness of the wings.

According to an Aspect 7, the hinged glass article of Aspect 6 is such that at least some of the small inclusions are within the glass of the wings.

According to an Aspect 8, the hinged glass article of Aspect 1 is such that the glass portion of the hinge is free of the small inclusions.

According to an Aspect 9, a hinged glass article comprises wings comprising glass and a hinge positioned between the wings. The wings fold about the hinge. The hinge comprises a glass portion integrally joined to the wings and a polymer portion overlaying the glass portion. The glass portion of the hinge comprises a first surface facing away from a second surface thereof. The polymer portion overlays the first surface. The glass portion of the hinge is asymmetric with the wings unfolded such that halves of the glass portion of the hinge do not mirror one another about a lengthwise middle of the hinge. The first surface of the glass portion of the hinge is free of small inclusions impinging thereupon that have a linear cross-sectional dimension extending fully thereacross and through a center thereof greater than 2 μm and less than 30 μm.

According to an Aspect 10, the hinged glass article of Aspect 9 is such that a depth profile taken lengthwise along the glass portion of the hinge halfway widthwise across the hinge comprises a descent from one of the wings into the hinge and an ascent from the hinge to another of the wings. Average slopes of the ascent and descent differ from one another by at least 1 μm/mm.

According to an Aspect 11, the hinged glass article of Aspect 9 is such that a depth profile taken lengthwise along the glass portion of the hinge halfway widthwise across the hinge comprises a greatest depth of the hinge in the profile. The greatest depth (of that profile) is not located at a lengthwise middle of the hinge (of that profile).

According to an Aspect 12, the hinged glass article of Aspect 11 is such that the greatest depth (of that profile) is located at least 100 micrometers (μm) from the lengthwise middle of the hinge, such as at least 250 μm, at least 500 μm, at least 1 millimeter (mm), at least 2 mm, and/or no more than 5 centimeters (cm).

According to an Aspect 13, the hinged glass article of Aspect 9 is such that depth profiles taken lengthwise along the hinge, separated from one another widthwise, differ from one another.

According to an Aspect 14, the hinged glass article of Aspect 13 is such that one of the depth profiles shows a width of the hinge at least 100 μm wider than another of the depth profiles.

According to an Aspect 15, the hinged glass article of Aspect 13 is such that one of the depth profiles shows a greatest depth at least 10 μm shallower than another of the depth profiles.

According to an Aspect 16, the hinged glass article of Aspect 9 is such that a depth profile taken lengthwise along the glass portion of the hinge halfway widthwise across the hinge comprises a descent from one of the wings into the hinge and an ascent from the hinge to another of the wings, wherein distance between the descent and ascent is at least 500 μm, such as >1 mm, >5 mm (e.g., $X_4$ to $X'_4$ in FIG. 9), and wherein a surface of the glass portion between the descent and ascent has a non-zero slope and/or non-zero average slope over that distance, such as a magnitude of slope and/or average slope >0.1 μm/mm, such as >0.2 μm/mm, >0.5 μm/mm, >1 μm/mm when determined by depth profile as disclosed herein.

According to an Aspect 17, the hinged glass article of Aspect 9 is such that the glass of the wings comprises small inclusions having a linear cross-sectional dimension extending fully thereacross and through a center thereof greater than 2 μm and less than 30 μm.

According to an Aspect 18 a hinged glass article includes wings comprising glass and a hinge positioned between the wings. The hinge comprises a glass portion integrally joined to the wings and a polymer portion overlaying the glass portion. The wings fold about the hinge. The wings have a thickness greater than 100 μm and the glass portion of the hinge has a thickness less than 100 μm. The glass portion of the hinge is asymmetric with the wings unfolded such that halves of the glass portion of the hinge do not mirror one another about a lengthwise middle of the hinge. A depth profile taken lengthwise along the glass portion of the hinge halfway widthwise across the hinge comprises a greatest depth of the hinge in the profile, where the greatest depth is located at least 100 μm from the lengthwise middle of the hinge. Further, the depth profile is a first profile, and a second such profile, spaced apart widthwise from the first profile, differs from the first profile with respect to magnitude of greatest depth of the respective profile, such as by at least 10 μm, such as by at least 20 μm, such as by at least 50 μm.

According to an Aspect 19, the hinged glass article of Aspect 18 is such that the glass of the wings comprises small inclusions having a linear cross-sectional dimension extending fully thereacross and through a center thereof greater than 2 μm and less than 30 μm.

According to an Aspect 20, the hinged glass article of Aspect 19 is such that the small inclusions comprise inclusions having a linear cross-sectional dimension greater than 10 μm.

Additional features and advantages are set forth in the detailed description that follows, and in part will be readily apparent to those skilled in the art from the description or recognized by practicing the technology as described in the written description and claims hereof, as well as the appended drawings. It is to be understood that both the foregoing general description and the following detailed description are merely exemplary and are intended to provide an overview or framework to understand the nature and character of the claims.

BRIEF DESCRIPTION OF THE FIGURES

The accompanying figures are included to provide a further understanding and are incorporated in and constitutes a part of this specification. The drawings of the figures illustrate one or more aspects of the present disclosure, and together with the detailed description explain principles and operations of the various aspects. As such, the disclosure will become more fully understood from the following detailed description, taken in conjunction with the accompanying figures, in which.

DETAILED DESCRIPTION

Before turning to the following detailed description and figure, which illustrate aspects of the present disclosure in detail, it should be understood that the present inventive technology is not limited to the details or methodology set forth in the detailed description or illustrated in the figure. For example, as will be understood by those of ordinary skill in the art, features and attributes associated with an aspect shown in the figure or described in the text relating to an aspect may be applied to another aspect described elsewhere in the text.

Figure 1:
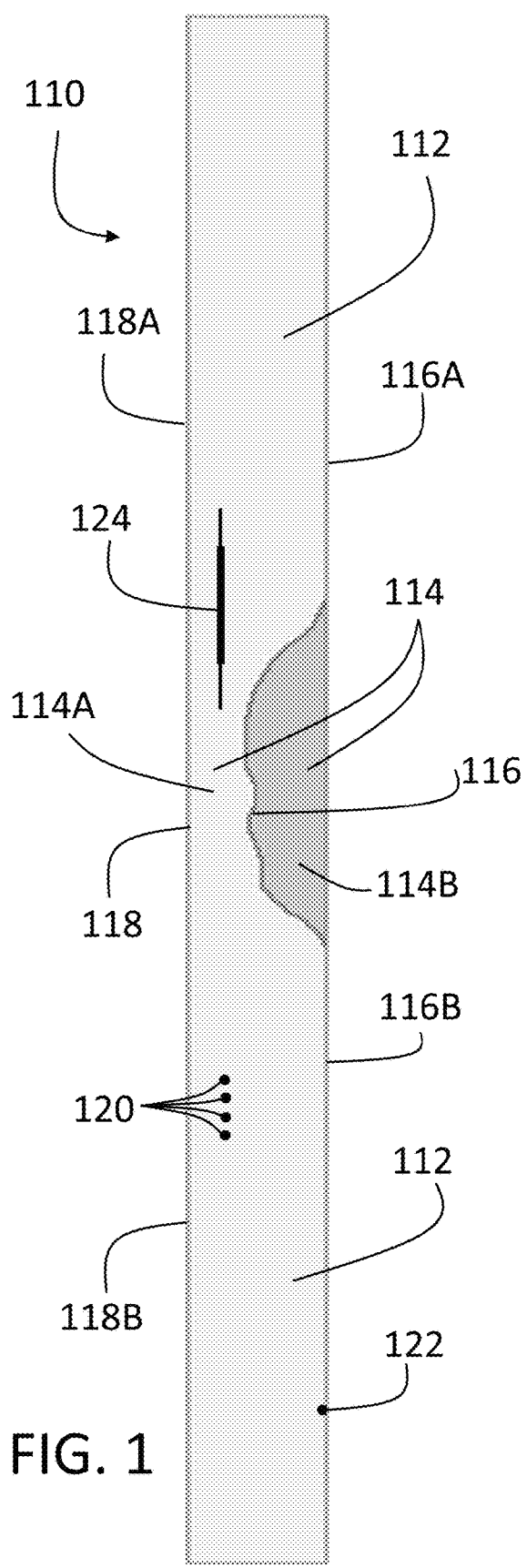
FIG. 1 is a side, conceptual view of a hinged glass article in an unfolded configuration according to an aspect of the present disclosure.

Referring to FIG. 1, a hinged glass article, such as hinged glass article 110, includes wings 112 and a hinge 114 therebetween, such as a so-called living hinge. According to an aspect of the present disclosure, the wings 112 are glass and are connected to one another by a glass portion 114A of the hinge 114. Moreover, the wings 112 and the glass portion 114A of the hinge 114 are formed from a single piece of glass (herein "glass" in the phrase "hinged glass article" is meant to include glass-ceramic, unless limited to an amorphous glass subset thereof or otherwise specified). As such, at least a portion of the hinge 114 integrally joins to and is positioned between the wings 112 such that the wings 112 fold about the hinge 114 (see FIG. 2). According to an aspect, the hinge 114 may include a second portion 114B formed from a material other than the glass of the first portion 114A. For example, the second portion 114B may be formed from a polymer (e.g., where the second portion 114B is a polymer portion), such as polymer index-matched to the glass.

According to an aspect of the present disclosure, the hinge 114 may include a first surface 116 and a second surface 118 facing away from the first surface 116. The wings too include first and second surfaces 116A, 116B, 118A, 118B. According to an aspect, the wings 112 are relatively flat and the first and second surfaces 116A, 116B, 118A, 118B define planes corresponding thereto that may be aligned with one another when the hinged glass article 110 is unfolded (as shown in FIG. 1) i.e. with the first surfaces 116A and 116B aligned along a common plane and the second surfaces 118A and 118B so aligned. Accordingly, along one side of the hinged glass article 110, the first surfaces 116A, 116B of the wings 112 each extend into the first surface 116 of the glass portion 114A of the hinge 114; and likewise the second surfaces 118A, 118B of the wings 112 extend into the second surface 118 of the hinge 114 therebetween.

According to an aspect of the present disclosure, the first surface 116 of the glass portion 114A of the hinge 114 defines a recess in glass of the hinged glass article 110, as shown in FIG. 1. The recess defined by the first surface 116 may be formed into the glass, such as etched and/or polished into the glass, such that the first surface 116 extends off of the plane corresponding the first surfaces 116A, 116B of the wings 112 adjoining the hinge 114. As shown in FIG. 1 (see also FIGS. 7-9), a profile of the first surface 116 may not be uniform or have a simple geometry, such as a box, oval, trapezoid, etc. and may instead have a complex and/or irregular geometry. In terms of overall geometry, the wings 112 may have thickness on the order of 100 µm or greater and/or not more than 0.5 mm, such as not more than 300 µm, and the recess (whether single-sided or with recesses on both sides) may have a thickness through the underlying glass of greater than 20 µm, such as greater than 30 µm, and/or not more than 120 µm, such as not more than 100 µm. With that said, other thicknesses are contemplated.

According to an aspect of the present disclosure, glass of the hinged glass article 110, forming the wings 112 and glass portion 114A of the hinge 114, may include a silicate glass (e.g., where silica is the greatest constituent by mol %), an alumino-silicate (e.g., further having at least 5 mol % alumina), alkali aluminosilicate glass (e.g., further having at least 5 mol % $R_2O$, where $R_2O$ represents alkali metal oxides, such as $Li_2O$, $Na_2O$, $K_2O$, $Rb_2O$, and $Cs_2O$), alkali-containing aluminoborosilicate glass (e.g., further having a positive amount of boria). In mole percent (mol %) of representative constituent oxides, the glass may include 40 mol % to 80 mol % silica ($SiO_2$), from 5 mol % to 30 mol % alumina ($Al_2O_3$), 0 mol % to 10 mol % boria ($B_2O_3$), 0 mol % to 5 mol % zirconia ($ZrO_2$), 0 mol % to 15 mol % phosphorus pentoxide ($P_2O_5$), 0 mol % to 2 mol % titania ($TiO_2$), 0 mol % to 20 mol % alkali metal oxides ($R_2O$), and 0 mol % to 15 mol % alkaline earth metal oxides plus zinc oxide (RO, such as MgO, CaO, SrO, BaO, and ZnO). The glass may optionally further comprise from 0 mol % to 2 mol % of each of $Na_2SO_4$, NaCl, NaF, NaBr, $K_2SO_4$, KCl, KF, KBr, $As_2O_3$, $Sb_2O_3$, $SnO_2$, $Fe_2O_3$, MnO, $MnO_2$, $MnO_3$, $Mn_2O_3$, $Mn_3O_4$, $Mn_2O_7$. Furthermore, as explained above, the glass may not necessarily be amorphous unless so limited (such as in claims provided herein), and may be a glass-ceramic, such as having from 1% to 99% crystallinity. The glass may include a glass-ceramics of the $Li_2O$—$Al_2O_3$—$SiO_2$ system (i.e., LAS-System), MgO—$Al_2O_3$—$SiO_2$ system (i.e., MAS-System), $ZnO\times Al_2O_3\times nSiO_2$ (i.e., ZAS system), and/or glass-ceramics that include a predominant crystal phase (i.e. greater than any other crystal phase in volume of the respective glass-ceramic) including β-quartz solid solution, β-spodumene, cordierite, jeffbenite, lithiophosphate, petalite, and/or lithium disilicate crystal phases.

According to an aspect of the present disclosure, the hinge 114 may further include a filler 114B positioned in the recess defined by the first surface 116. According to an aspect, the filler 114B is bonded to the glass portion 114A of the hinge 114. According to an aspect, the filler 114B is an organic material, such as a polymer, such as a plastic, a thermoplastic, an epoxy, etc. which may be more elastic than the glass of the glass portion 114A. A modulus of elasticity of the filler 114B may be less than that of the glass, such as less than a tenth that of the glass, such as less than a hundredth that of the glass. For example, the glass of the glass portion 114A may have a modulus of about 70-80 GPa and the filler 114B may have a modulus in MPa, such as less than 1 GPa, such as less than 100 MPa.

According to an aspect of the present disclosure, the filler 114B may include, for example, a polyolefin, a polyamide, a halide-containing polymer (e.g., polyvinylchloride or a fluorine-containing polymer), an elastomer, a urethane, phenolic resin, parylene, polyethylene terephthalate, and polyether ether ketone. Examples of such polyolefins include polyethylene and polypropylene. Examples of such elastomers include rubbers (e.g., polybutadiene, polyisoprene, chloroprene rubber, butyl rubber, nitrile rubber), and block copolymers (e.g., styrene-butadiene, high-impact polystyrene, poly(dichlorophosphazene)). Further, the filler 114B may include an optically clear polymer, such as an acrylic (e.g., poly methyl methacrylate), an epoxy, silicone, and/or a polyurethane. Examples of such epoxies include bisphenol-based epoxy resins, novolac-based epoxies, cycloaliphatic-based epoxies, and glycidylamine-based epoxies. For example, the optically clear polymer may include 3M 8212 adhesive, LOCTITE AD 8650, LOCTITE AA 3922, LOCTITE EA E-05MR, and/or LOCTITE UK U-09LV (available from Henkel).

While FIG. 1 shows a hinge with a recess on one side, Applicants contemplate the second surface 118 may be formed as a recess in glass of the hinged glass article 110 and overlayed by a filler, such as the above-described filler 114B, and/or both the first and second surfaces 116, 118 may be formed as recesses in glass of the hinged glass article 110 and overlayed with such fillers. Applicants further contemplate the hinge 114 may be fully formed from glass having a thickness matching that of the wings 116. Both the wings 112 and the hinge 114 may be thin or flexible enough to fold. For example, such a hinge 114 may overlay a mechanical hinge in a foldable display panel, whereby the underlying mechanical hinge in the panel facilitates folding of the hinged glass article 110 along the hinge 114 thereof.

Figure 2:
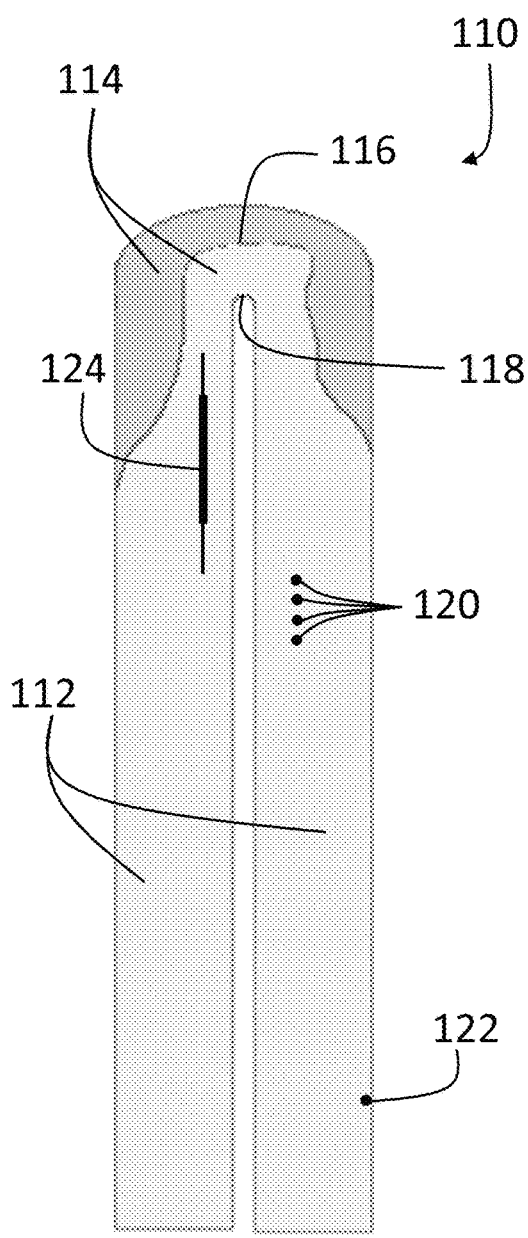
FIG. 2 is a side, conceptual view of the hinged glass article of FIG. 1 in a folded configuration.

Referring to FIG. 2, the hinged glass article 110 of FIG. 1 is shown as folded in half about the hinge 114. When folded as shown, the first surface 116 of the hinge 114 may experience a greater amount of tension than the second surface 118 of the hinge 114, such as with the first surface 116 experiencing a positive-amount of tension or tensile stress and/or the second surface 118 experiencing a positive-amount of compression or compressive stress. A neutral axis of bending for the hinged glass article 110 may extend within the glass portion 114A of the hinge 114. The filler 114B may stretch and elastically deform. According to an aspect, the hinge may be off-center, such that one folded side of the hinged glass article 110 is longer or larger than another. The hinged glass-article may include more than one hinge, such as two, three, or four hinges, facilitating different ways to fold the respective hinged glass-article.

Still referring to FIGS. 1-2, glass of the hinged glass article 110 includes inclusions 120, 122, 124. The inclusions 120 may be small defects in the glass of the hinged glass article 110. For example, the inclusions 120 may be gaseous bubbles (also called blisters or seeds), unmelted batch material (e.g., silica sand grains), small pieces of refractory ceramic (e.g., alumina zirconia silica), and/or particles of metal (e.g., globular platinum particles; platinum needle inclusions) or prints of such particles in surfaces of the glass, left behind if the particles dislodge. However, crystals of a crystal phase formed in a glass-ceramic and homogenously distributed therein, nucleated in and formed from surrounding constituents in a precursor glass phase thereof, are excluded from the term inclusions as used herein. For example, a glass-ceramic comprising lithium disilicate crystals in a glass phase may be free of inclusions, or may further include inclusions as disclosed herein, such as a globular particle of platinum having a linear cross-sectional dimension of 10 μm for example. Crystals of a glass-ceramic may be far smaller than inclusions having a cross-sectional dimension of 2 μm for example, such as petalite or disilicate crystals with a largest cross-sectional dimension less than 100 nanometers (nm) for example.

Of the above different types of inclusions, Applicants find that platinum inclusions, such as needles and globular platinum particles may be particularly problematic if positioned at a surface of the hinged glass article 110 in tension, such as the first surface 116. As used herein, "platinum" inclusions need not be 100% pure platinum in composition, and includes alloys of platinum, where a platinum component may be shown through energy dispersive spectroscopy. Without being bound by any particular theory, Applicants believe that the platinum inclusions may not be bonded to surrounding glass and accordingly may impart a print into the glass that may include stress concentration sites or nucleation sites corresponding to local features (e.g., edges, protrusions) of the platinum inclusions. These inclusions may occur as a function of flow rate, temperature, and/or composition of the glass, as the glass in a molten state interfaces with platinum piping or other platinum equipment supporting the glass, and when wear occurs during manufacturing thereof.

Figure 3:
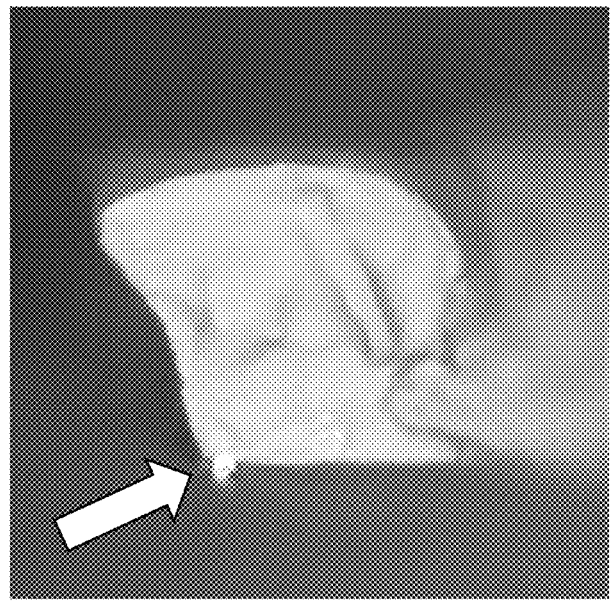
FIG. 3 is a micrograph of a fracture surface with an arrow pointing toward an inclusion.
Figure 4:
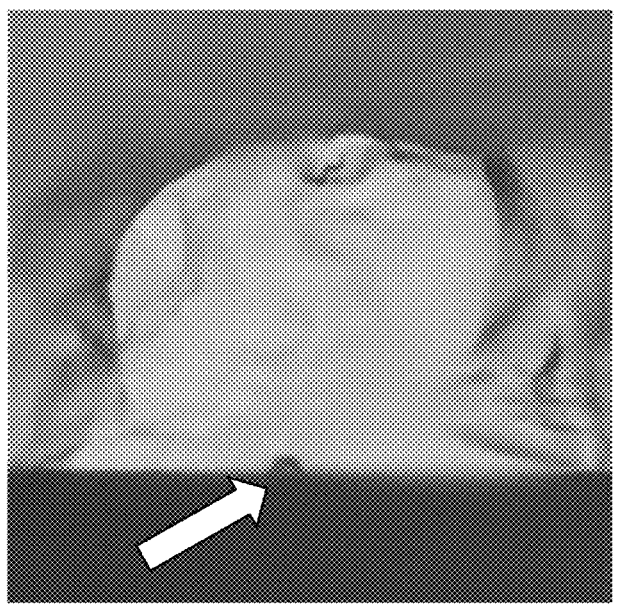
FIG. 4 is a micrograph of another fracture surface.

Applicants impregnated glass with platinum particles and examined failed articles. FIGS. 3-4 include microscopy of two such failures. More specifically, in FIG. 3, the arrow points toward a globular platinum particle embedded in the glass near the surface. In FIG. 4, the arrow points to a print, presumably formed by a dislodged globular platinum particle, similar to the particle shown in FIG. 3. Inclusions leading to failure of the respective articles were located on surfaces thereof; which, when subjected to tensile loading, nucleated and propagated cracks that then led to failure. Further, through finite element modeling of glass with unbonded solid inclusions, representing platinum inclusions, Applicants found that proximity of the inclusions to the hinged surface in tension determined reliability—and articles with inclusions at or impinging upon the surface more readily led to failure, as opposed to inclusions simply buried within the articles or in the articles away from the hinge surface.

Figure 5:
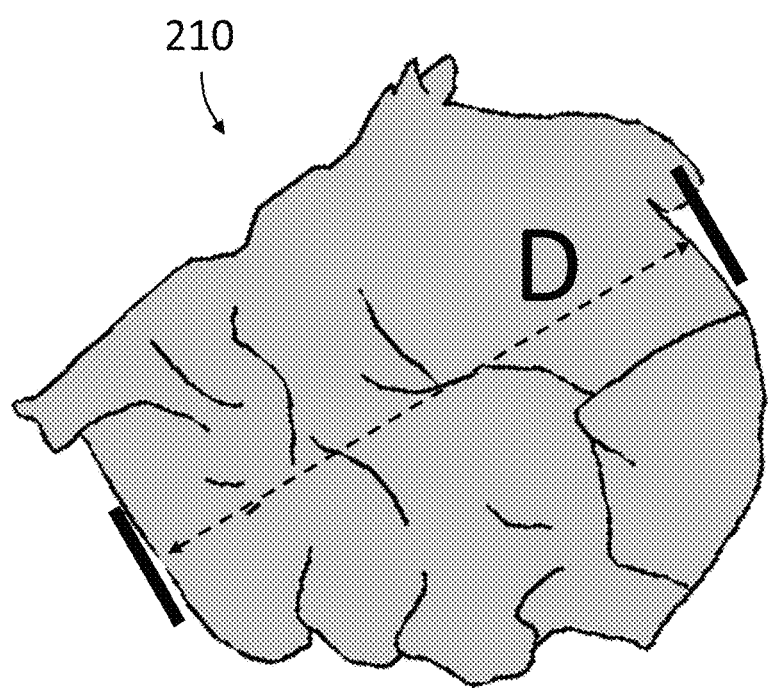
FIG. 5 is a side, conceptual view of an inclusion.

The particle 210 of FIG. 5 represents an inclusion, such as the inclusions 120 and/or such as a globular platinum inclusion. According to an aspect of the present disclosure, the particle 210 is generally small, having a linear cross-sectional dimension D, extending fully thereacross and through a center thereof, that is greater than 1 μm, such as greater than 1.5 μm, such as greater than 2 μm, such as greater than 3 μm, such as greater than 5 μm, such as greater than 10 μm, and/or less than 100 μm, such as less than 50 μm, such as less than 30 μm, such as less than 25 μm, such as less than 20 μm, or any such combination of size constraints, such as greater than 2 μm and less than 30 μm, which may be sizes of such particles that may decrease reliability of the hinged glass article 110 if located on the first surface 116, but may also be small enough not to be noticed.

According to an aspect of the present disclosure, the inclusions 120 of FIGS. 1-2, represented by the particle 210 of FIG. 5, form a train or string of at least three of such inclusions 120 that are generally aligned with one another and in close proximity to one another. According to an aspect, a line connecting geometric centroids of two such inclusions 120 transposed onto the nearest plane defined by the wing surfaces 116A, 116B, 118A, 118B is oriented within 30-degrees of another line connect geometric centroids of a different two such inclusions 120 transposed to the same plane, such as within 25-degrees, such as within 20-degrees, such as within 10-degrees, such as within 5-degrees. Such aligned inclusions may comprise platinum, as disclosed above, or may be other inclusions, such as gaseous inclusions.

According to an aspect, inclusions such as the particle 210 (or particle 310 of FIG. 6) may impinge upon certain surfaces of the hinged glass article 110, such as is shown with the particle 122 shown in FIGS. 1-2, but not the surface of the hinge in tension during folding, such as the surface 116 in FIGS. 1-2. Impingement herein refers to the corresponding inclusion actually breaking the surface or being in very close proximity thereto, such as at least partially positioned at a depth from the surface of less than 5 µm, whereby the inclusions may influence local geometry of the surface (e.g., local bulge or recess on the surface, especially when the surface is in tension as the article folds), and having a linear cross-sectional dimension of at least 2 µm, such as at least 5 µm, such as at least 10 µm, or as otherwise disclosed herein. Such inclusions may be observed by microscopy (e.g., scanning electron microscopy) showing the actual inclusion or a print thereof on the surface (see, e.g., FIGS. 3-4), and further characterized by energy dispersive spectroscopy of a corresponding particle for example.

Figure 6:
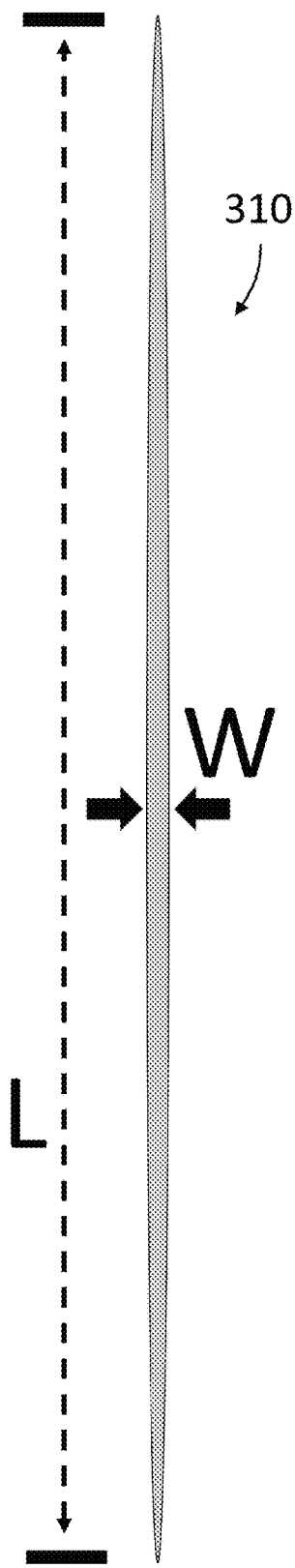
FIG. 6 is a side, conceptual view of another inclusion.

Referring to FIGS. 1-2 and 6, hinged glass articles, such as the hinged glass article 110 of FIGS. 1-2 may include acicular (i.e. needle-shaped) inclusions, such as the inclusion 124 in FIGS. 1-2. The inclusion 124 may be an elongate gaseous inclusion (i.e. bubble, blister, seed) or a needle-shaped metallic inclusion, such as a platinum needle inclusion, for example. Inclusion 310 of FIG. 6 is representative of such an inclusion. Although shown as straight in FIG. 6, elongate inclusions may bend and/or branch within glass of the hinged glass article.

According to an aspect, a length L of such elongate inclusions (e.g., platinum needle inclusions) may be at least 10 µm, such as at least 20 µm, such as at least 30 µm, such as at least 50 µm, such as at least 100 µm, such as at least 150 µm, such as at least 200 µm, and/or no more than 500 µm, such as no more than 300 µm, for example; where width W (and/or thickness; i.e. a cross-sectional dimension orthogonal to the length L) of such elongate inclusions may be no more than half the length L thereof, such as no more than a third, a quarter, a tenth, a twentieth, a fiftieth, a hundredth the length L thereof, and/or at least a ten-thousandth the length L, such as at least a thousandth, such as at least a hundredth the length L.

Etchant (e.g., acid, hydrofluoric acid) may be used to cut a recess into glass of the hinged glass article, to form a hinge of reduced thickness when compared to adjoining wings. Timing of the etching and masks (e.g., etchant-resistant or -delaying tapes, coatings) can be used to control the etchants and to correspondingly influence shape of the recess. Once formed, a surface of the glass may be closely inspected for inclusions impinging upon the surface. Alternatively, the entire hinge may be closely inspected for inclusions that could potentially impinge upon the surface. If found, the surface can be further modified (e.g., cut, polished, etched) to remove the impinging inclusions. Alternatively, if found, the article may be discarded.

Figure 7:
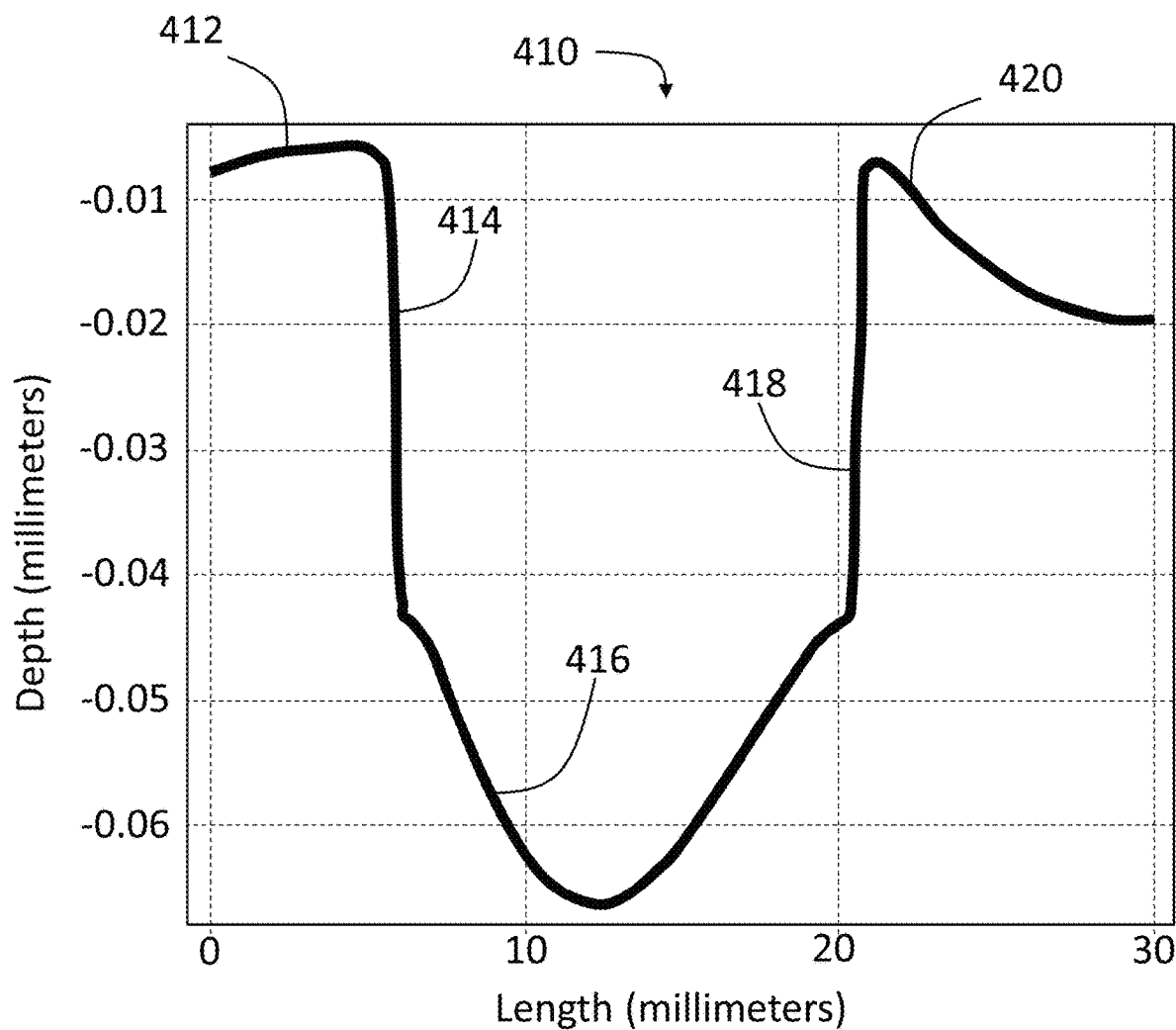
FIGS. 7-9 are profiles in depth taken along a lengthwise axis over hinges of a hinged glass articles according to an aspect of the present disclosure.
Figure 8:
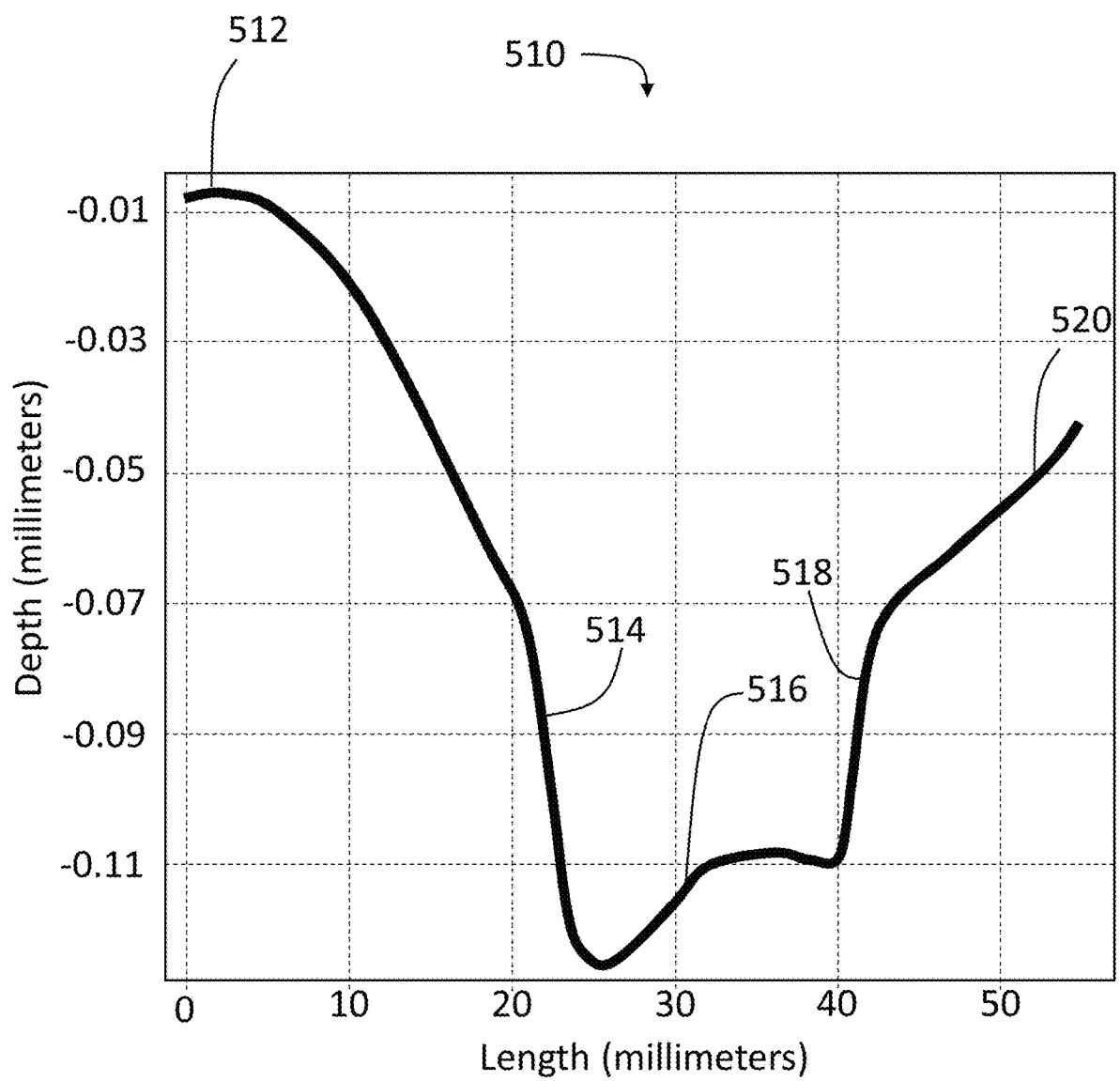
Figure 9:
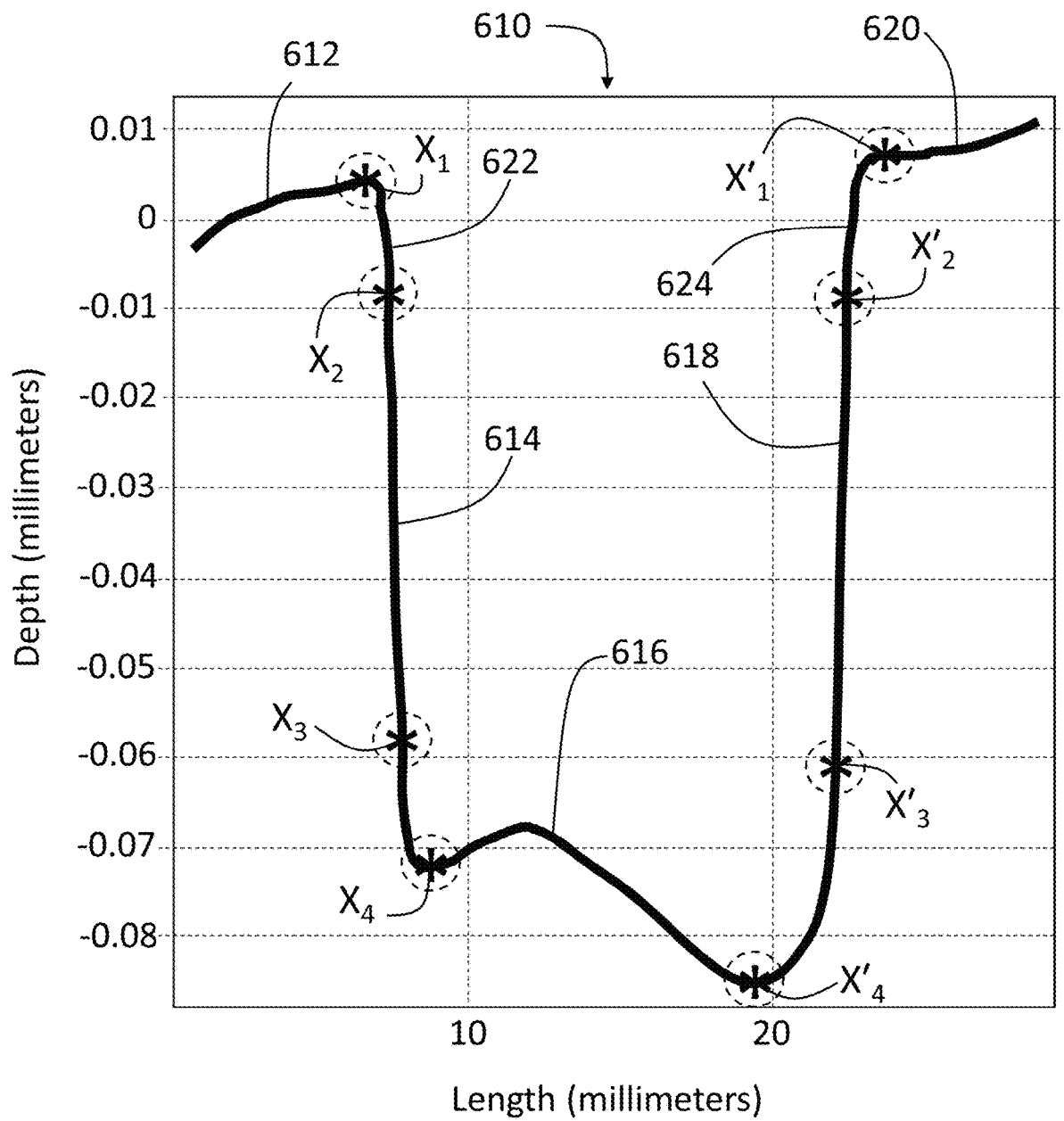

Especially with inclusions in the glass as described herein, use of etchant to form a recess into glass, such as with some inclusions in the glass being removed by the etchants, may result in formation of complex geometries-recess surfaces not conforming to a simple geometric description such as rectangular, oval, trapezoidal, flat, etc. FIGS. 7-9 show two-dimensional profiles of such recesses. Certainly other factors also may influence such geometries, such as etchant uniformity, turbulence and flow of etchants during etching, differences in timing as etchants are delivered, non-uniformity or differences in mask features.

While geometry varies between each of the profiles 410, 510, 610, there are some generally common features-such as (from left to right in the FIGS. 7-9) a (flat) first wing 412, 512, 612; a descent 414, 514, 614 from the first wing 412, 512, 612 into a hinge portion 416, 516, 616; a center hinge portion 416, 516, 616, which may include rolling, uneven topography (see, e.g., center hinge portions of profiles 410, 510, 610); then an ascent 418, 518, 618 from the center hinge portion 416, 516, 616 to a second wing 420, 520, 620; and then (flat) second wing 420, 520, 620. For purposes of the present disclosure, the "hinge" includes the descent 414, 514, 614 and ascent 418, 518, 618 as well as the center hinge portion 416, 516, 616.

Surprisingly, additional resources in terms of polishing agents, equipment, and work/energy to create symmetric, uniform profiles of simple geometries, such as trapezoidal cuts with flat ramps into and out of a flat bottom surface or smooth sinusoidally-curving or rounded inclines into a rounded, oval-shaped bottom for example, may be unnecessary to achieve a reliable hinge with low visibility; and hinges with complex profiles such as those profiles 410, 510, 610 in FIGS. 7-9 work well, and complex or irregular geometry may even obscure features of the hinge, making the hinge less visible compared to one with sharp, clean lines of simple geometry.

This finding may be surprising because asymmetry, small bumps, budges, depressions, changes in slope or curvature, or other such complex geometric features of the center hinge portion 416, 516, 616 may be sources of local stress concentration when the center hinge portion 416, 516, 616 folds. However, in the absence of inclusions impinging upon the surface as described herein, such complex geometric features may not undermine reliability of the hinged glass article. Without being bound to any particular theory, these features may be dulled at a local-level by etchant during formation of recesses, thereby mitigating impact of local stress concentrations corresponding to such features.

To analyze and compare profiles of different hinged glass articles, Applicants identify specific reference locations corresponding to common features of each descent/ascent of the respective profiles. From left to right of the profiles, such as profiles 410, 510, 610 in FIGS. 7-9 for example, the first location $X_1$ (see FIG. 9) is a start of the hinge, that being a transition 622 from the first wing 612 to the descent 614, the second location $X_2$ is a point of greatest curvature (as defined below) of the descent 614, the third location $X_3$ is a point of least curvature in the descent 614, and the fourth location $X_4$ is an end of the descent 614 as the descent 614 transitions to the central hinge portion 616. Points $X'_4$, $X'_3$, $X'_2$, and $X'_1$ are the same demarcations but in reverse order when continuing from left to right, where prime (') denotes the ascent 618, which may have different values for the same parameters than those of the descent 614 due to asymmetry and complex geometry. Accordingly, fourth location $X'_4$ is a start the ascent 618, third location $X'_3$ is a point of least curvature in the ascent 618, second location $X'_2$ is a point of greatest curvature in the ascent 618, and first location $X'_1$ demarcates the end of a transition 624 to the second wing 620.

Figure 10:
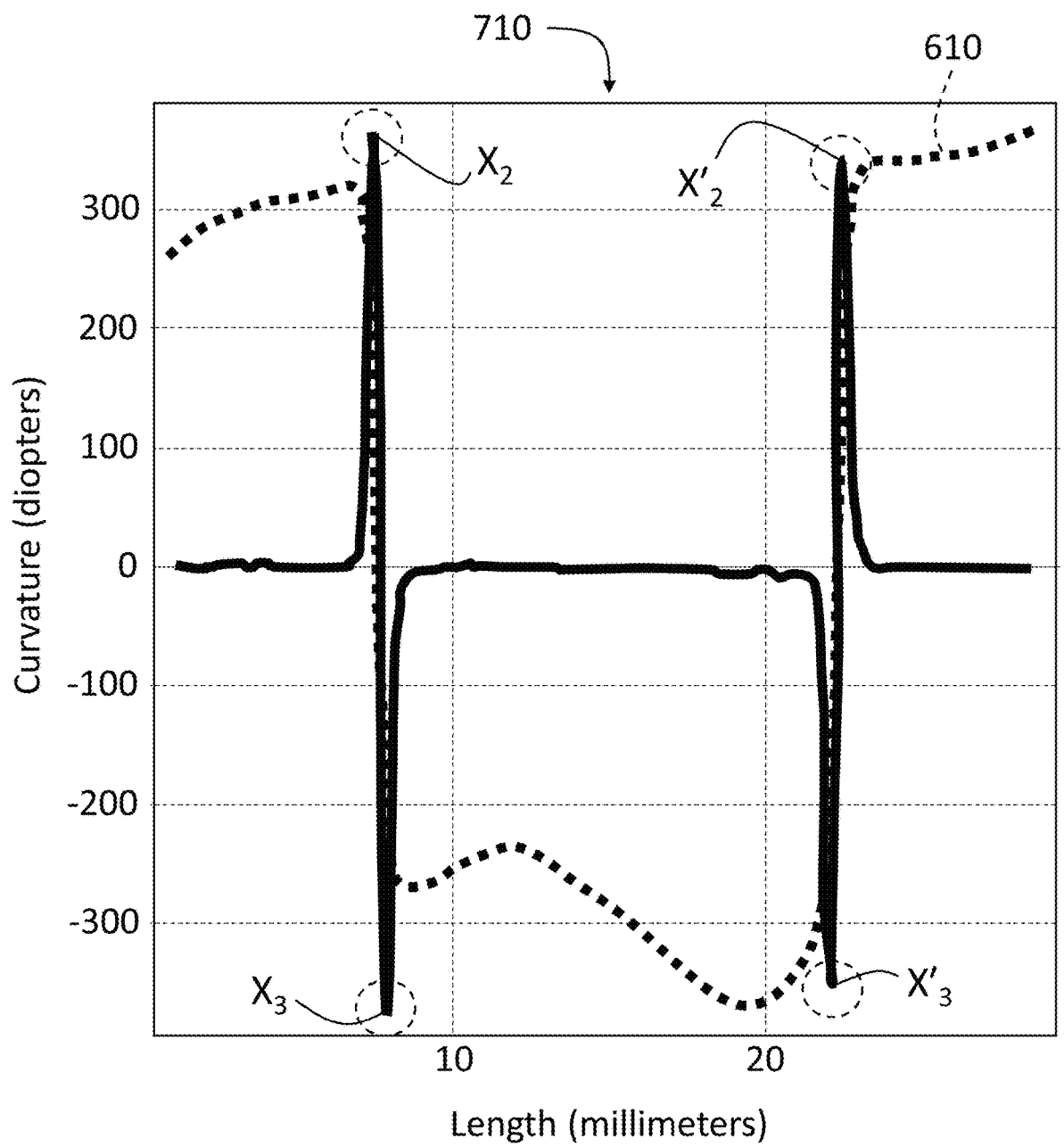
FIG. 10 is a plot of curvature of the profile of FIG. 9, overlaying that profile.
Figure 11:
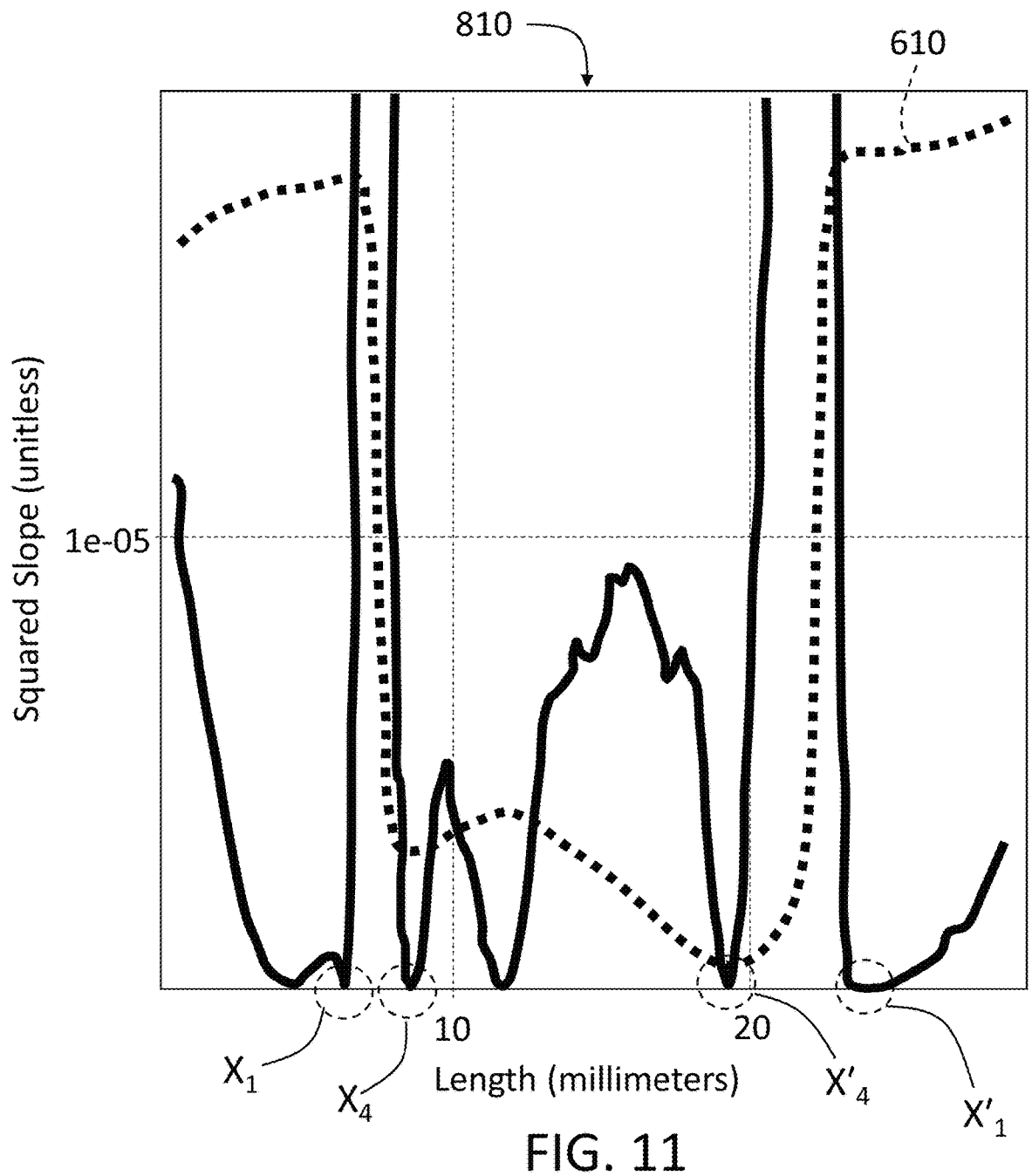
FIG. 11 is a plot of slope squared of the profile of FIG. 9, overlaying that profile.

The profiles are measured along a surface of a hinged glass article, such as the surfaces 116A, 116, 116B of the hinged glass article 110 in the unfolded configuration of FIG. 1. Two-dimensional profiles may be taken along any swatch across the width of a hinged glass article, but are taken along a centerline (midway widthwise across) unless otherwise specified. More specifically for the profiles of FIGS. 7-9, a stylus profilometer with measurement speed of 1.5 mm/second, measurement pitch of 0.001 mm, and stylus tip radius of about 0.01 mm (e.g., from 0.0076 to 0.0101 mm) gathered data, which was then filtered by 1 mm Gaussian low pass filter as per ISO 16610-21:2011 for smoothing to control noise. Measurement speed of the profilometer may be reduced to potentially improve accuracy, such as down to 0.15 mm/second, such as for more complex profiles. From that data, slope for each successive point (i) having lengthwise (X) and depth (Y) coordinates, i.e. $(X_i, Y_i)$, was calculated as:

$$\text{slope}(i)=(Y_{i+1}-Y_{i-1})/(2*dx)$$

where dx is the pitch. Curvature for a point (i) is a function of the slope (i) and is calculated as:

$$\text{curvature}(i)=-[(Y_{i+1}-2*Y_i+Y_{i-1})/((dx)^2)]/(1+(\text{slope}(i))^2)^{1.5}$$

where Applicants use the convention of negative curvature. FIG. 10 includes a plot of the curvature for the profile of FIG. 9 along length of the profile, and FIG. 11 is a plot of the slope squared along length of the profile.

Then, to further characterize the profiles, the locations $X_1$, $X_2$, $X_3$, $X_4$ (as well as locations $X'_1$, $X'_2$, $X'_3$, $X'_4$) may be determined based on slope and curvature of a profile. Referring to FIG. 10, a plot 710 of curvature 712 overlays the profile 610 (of FIG. 9 in dashed lines in FIGS. 10-11), and the second and third locations $X_2$ and $X_3$ (as well as $X'_2$ and $X'_3$) are determined as extrema of the magnitude of curvature along the profiles. With locations $X_2$ and $X_3$ identified, locations $X_1$ and $X_4$, corresponding to start and end of the descent 614 (or $X'_4$ and $X'_1$, for the start and end of the ascent 618) may be determined using a square of the slope 810, as shown in FIG. 11, where $X_1$ is the location where squared slope is at a minima (i.e. local minimum) closest to the left (i.e. lesser lengthwise X location) of the location $X_2$, and $X_4$ is accordingly where squared slope is at a minima closest to the right of the $X_3$ location. FIG. 9 shows the locations $X_1$, $X_2$, $X_3$, $X_4$ plotted on the profile. According to the above technique, the length of the descent 614 was 2.15 mm (i.e. $X_4-X_1$) and the depth was 0.076 mm (i.e. $Y_1-Y_4$, where $Y_1$ is depth value at $X_1$ and $Y_4$ is depth at $X_4$), while the ascent 618 was 4.17 mm wide and 0.092 mm deep, with the full hinge width between the wings 612, 620 (i.e. $X'_1-X_1$) of 16.78 mm. Applicants believe the above analysis approach may be used on a broad range of different profiles and hinge geometries—to measure shape of the profiles, as well as local parameters, such as the slope and curvature.

According to an aspect of the present disclosure, profiles of hinges (e.g., FIGS. 7-9) are not symmetric about a center (lengthwise midpoint) of the hinge i.e. the profiles are asymmetric such that features of one side (e.g., ascent) do not mirror those of the other side (e.g., descent). For example, average slopes of the ascent and descent differ from one another, such as differ from one another by at least 1 μm/mm when taken between points $X_1$ and $X_4$ and between points $X'_1$ and $X'_4$ of the respective descent or ascent, such as by at least 2 μm/mm, such as at least 5 μm/mm, at least 10 μm/mm, at least 50 μm/mm, at least 100 μm/mm, at least 500 μm/mm, and/or no more than 10 mm/mm.

According to an aspect of the present disclosure, location of a greatest depth (Y-direction of FIGS. 7-9) of a hinge does not overlay a lengthwise midpoint of the hinge; where, in terms of the profile parameters above, the least value of $Y_i$ does not occur at $X=(X'_1-X_1)/2$. Instead, the greatest depth of the hinge is spaced apart from the lengthwise midpoint, such as by at least 100 μm, such as at least 200 μm, at least 300 μm, at least 500 μm, and/or no more than 10 mm. According to an aspect, the greatest depth of the hinge is spaced apart from the lengthwise midpoint by at least 2% of the length of the hinge $(X'_1-X_1)$, such as at least 3%, at least 5%, at least 10%, and/or no more than 40%.

As indicated above, two-dimensional profiles (length as X, depth as Y) are taken lengthwise over a hinge (i.e. from first wing, to hinge, to second wing) along a centerline that is midway widthwise across a hinged glass article, unless otherwise specified. However, according to an aspect, depth profiles taken lengthwise over a hinge along different swaths, separated widthwise from one another, may not overlay one another. Put another way, according to an aspect, profiles of the same hinge differ from one another if taken along different swaths over the hinge, where the different swaths are separated from one another widthwise.

More specifically, according to an aspect of the present disclosure, a profile of a hinge near (e.g., 10 micrometers inward therefrom) a widthwise edge of a hinged glass article may be wider (i.e., greater $X'_1-X_1$) than a profile of the same hinge along a widthwise center swath, such as by at least 10 μm, such as by at least 30 μm, at least 50 μm, at least 100 μm, such as at least 200 μm, and/or no more than 10 mm.

According to an aspect of the present disclosure, a profile of a hinge near a widthwise edge may have a shallower greatest depth than a profile of the same hinge along a widthwise center swath, such as by at least 10 μm, such as by at least 30 μm, at least 50 μm, at least 100 μm, and/or no more than 10 mm.

According to an aspect of the present disclosure, the hinge portion 616 between the descent 614 and ascent 618, such as between locations $X_4$ and $X'_4$, has a non-zero average slope, such as at least 0.1 μm/mm, such as at least 0.2 μm/mm, such as at least 0.5 μm/mm, such as at least 1 μm/mm, as shown in FIG. 9 for example, and/or no more than 0.5 mm/mm, such as no more than 0.1 mm/mm. While not flat or symmetric, Applicants find such a slope may have little impact on the resulting hinge performance.

It may be counterintuitive to make thin, fragile glass articles fold with features as disclosed herein, such as with inclusions and geometric irregularities, that some may see as defects. However, Applicants discovered many such features may not undermine performance, and such manufacturing can save resources in mining and production, including energy and time.

Construction and arrangements of the compositions, structures, assemblies, and structures, as shown in the various aspects, are illustrative only. Although only a few examples of the aspects have been described in detail in this disclosure, modifications are possible (e.g., variations in sizes, dimensions, structures, shapes, and proportions of the various elements, values of parameters, mounting arrangements, use of materials, colors, orientations) without materially departing from the novel teachings and advantages of the subject matter described herein. The order or sequence of any process, logical algorithm, or method steps may be varied or re-sequenced according to alternative embodiments. Other substitutions, modifications, changes and omissions may also be made in the design, operating conditions and arrangement of the various aspects without departing from the scope of the present inventive technology.

What is claimed is:

1. A hinged glass article, comprising:
    wings comprising glass; and
    a hinge positioned between the wings and comprising a glass portion integrally joined to the wings;
    wherein the glass portion of the hinge comprises a first surface facing away from a second surface thereof;
    wherein the glass portion of the hinge has a thickness between the first and second surfaces that is less than a thickness of the wings;
    wherein the wings fold about the hinge with the first surface experiencing a greater tensile stress than the second surface, when the wings are folded;
    wherein the hinged glass article comprises small inclusions, each of which having a linear cross-sectional dimension extending fully thereacross and through a center thereof greater than 2 µm and less than 30 µm;
    wherein the small inclusions comprise platinum particles;
    wherein at least some of the small inclusions are within the glass of the wings; and
    wherein the glass portion of the hinge is free of the small inclusions.

2. The hinged glass article of claim 1, wherein the platinum particles are acicular.

3. The hinged glass article of claim 1, wherein at least some of the platinum particles have a length of at least 10 µm and a width orthogonal thereto less than a third of the length.

4. The hinged glass article of claim 1, wherein the small inclusions of the glass comprise inclusions having a linear cross-sectional dimension greater than 10 µm.

5. The hinged glass article of claim 1, further comprising a polymer portion overlaying the glass portion of the hinge.

6. The hinged glass article of claim 5, wherein the polymer portion overlays the first surface.

7. The hinged glass article of claim 1, wherein the glass portion of the hinge is asymmetric with the wings unfolded such that halves of the glass portion of the hinge do not mirror one another about a lengthwise middle of the hinge.

8. The hinged glass article of claim 7, wherein a depth profile taken along a centerline of the hinged glass article across the hinge comprises a descent from one of the wings into the hinge and an ascent from the hinge to another of the wings, and wherein average slopes of the ascent and descent differ from one another in magnitude by at least 1 µm/mm.

9. The hinged glass article of claim 7, wherein a depth profile taken along a centerline of the hinged glass article across the hinge comprises a greatest depth of the hinge in the profile, wherein the greatest depth is not located at a center of the hinge.

10. The hinged glass article of claim 9, wherein the greatest depth is located at least 100 µm from the center of the hinge.

11. The hinged glass article of claim 1, wherein depth profiles taken across different locations of the hinge differ from one another.

12. The hinged glass article of claim 11, wherein one of the depth profiles shows a width of the hinge at least 100 µm wider than another of the depth profiles, the width being measured as a lengthwise distance between transition ends associated with an ascent and a decent of the hinge.

13. The hinged glass article of claim 11, wherein one of the depth profiles shows a greatest depth at least 10 µm shallower than another of the depth profiles.

14. The hinged glass article of claim 1, wherein a depth profile taken along a centerline of the hinged glass article across the hinge comprises a descent from one of the wings into the hinge and an ascent from the hinge to another of the wings, wherein a surface of the glass portion between the descent and ascent has a non-zero slope.

15. The hinged glass article of claim 14, wherein the depth profile is a first profile, and a second such profile, spaced apart from the first profile, differs from the first profile with respect to magnitude of greatest depth of the respective profile by at least 10 µm.

16. The hinged glass article of claim 1, wherein the wings have a thickness greater than 100 µm and the glass portion of the hinge has a thickness less than 100 µm.

* * * * *